United States Patent
Nikolaev et al.

(10) Patent No.: US 9,454,978 B2
(45) Date of Patent: *Sep. 27, 2016

(54) SENSOR STRUCTURE HAVING INCREASED THERMAL STABILITY

(71) Applicant: Seagate Technology, LLC, Cupertino, CA (US)

(72) Inventors: Konstantin Nikolaev, Bloomington, MN (US); Taras Pokhil, Arden Hills, MN (US); Andrzej Stankiewicz, Edina, MN (US); Mohammed Patwari, Eden Prairie, MN (US); Eric Singleton, Maple Plain, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/884,527

(22) Filed: Oct. 15, 2015

(65) Prior Publication Data

US 2016/0118066 A1    Apr. 28, 2016

Related U.S. Application Data

(62) Division of application No. 14/524,142, filed on Oct. 27, 2014, now Pat. No. 9,196,272.

(51) Int. Cl.
*G11B 5/39* (2006.01)
*H01L 43/08* (2006.01)

(52) U.S. Cl.
CPC ........... *G11B 5/3906* (2013.01); *G11B 5/3912* (2013.01); *H01L 43/08* (2013.01); *G11B 2005/3996* (2013.01); *Y10T 29/49034* (2015.01)

(58) Field of Classification Search
None
See application file for complete search history.

(56) References Cited

U.S. PATENT DOCUMENTS

| | | | |
|---|---|---|---|
| 6,166,948 A * | 12/2000 | Parkin | B82Y 25/00 365/158 |
| 6,801,414 B2 | 10/2004 | Amano et al. | |
| 6,831,312 B2 | 12/2004 | Slaughter et al. | |
| 7,063,904 B2 | 6/2006 | Ikarashi et al. | |
| 7,149,105 B2 | 12/2006 | Brown et al. | |
| 7,312,958 B2 | 12/2007 | Aono | |
| 7,379,280 B2 | 5/2008 | Fukumoto et al. | |
| 7,764,471 B2 | 7/2010 | Mizuno et al. | |
| 7,978,439 B2 | 7/2011 | Zhang et al. | |
| 8,339,754 B2 | 12/2012 | Zhang et al. | |
| 8,908,423 B2 | 12/2014 | Honjou | |
| 9,196,272 B1 * | 11/2015 | Nikolaev | F27D 19/00 |
| 2004/0041183 A1 | 3/2004 | Slaughter et al. | |
| 2005/0219769 A1 | 10/2005 | Shimura et al. | |
| 2006/0012926 A1 * | 1/2006 | Parkin | G11B 5/39 360/324.2 |
| 2006/0056114 A1 | 3/2006 | Fukumoto et al. | |
| 2006/0061915 A1 * | 3/2006 | Zhang | B82Y 10/00 360/324.11 |
| 2006/0174473 A1 * | 8/2006 | Oh | B82Y 10/00 29/603.08 |
| 2007/0139827 A1 | 6/2007 | Gao et al. | |
| 2007/0217088 A1 | 9/2007 | Freitag et al. | |
| 2008/0062581 A1 * | 3/2008 | Parkin | B82Y 10/00 360/324.11 |
| 2008/0080101 A1 | 4/2008 | Mauri et al. | |
| 2008/0278865 A1 | 11/2008 | Tsunekawa et al. | |
| 2009/0046397 A1 | 2/2009 | Sun et al. | |
| 2011/0268992 A1 | 11/2011 | Zhang et al. | |
| 2013/0236744 A1 | 9/2013 | Brinkman et al. | |
| 2014/0120374 A1 * | 5/2014 | Zhu | G11B 5/3912 428/811.3 |

* cited by examiner

*Primary Examiner* — Will J Klimowicz
(74) *Attorney, Agent, or Firm* — HolzerIPLaw, PC (57) ABSTRACT

A reader sensor having a dusting layer having a thickness less than 5 Angstroms between and in contact with the AFM layer and with the pinned layer. The dusting layer comprises a non-magnetic, electrically conducting material, such as ruthenium or iridium. The reader sensor has a free layer composed of a material free of nickel (Ni).

13 Claims, 6 Drawing Sheets

SENSOR STRUCTURE HAVING INCREASED THERMAL STABILITY

CROSS-REFERENCE TO RELATED APPLICATION

This application is a divisional application of U.S. application Ser. No. 14/524,142 filed Oct. 27, 2014, now issued as U.S. Pat. No. 9,196,272, the entire disclosures of which are incorporated herein by reference.

BACKGROUND

In a magnetic data storage and retrieval system, a magnetic read/write head includes a reader portion having a magnetoresistive (MR) sensor for retrieving magnetically encoded information stored on a magnetic disc. Magnetic flux from the surface of the disc causes rotation of the magnetization vector of a sensing layer of the MR sensor, which in turn causes a change in electrical resistivity of the MR sensor. The change in resistivity of the MR sensor can be detected by passing a current through the MR sensor and measuring a voltage across the MR sensor. External circuitry then converts the voltage information into an appropriate format and manipulates that information to recover the information encoded on the disc.

SUMMARY

One particular implementation described herein is a reader sensor stack having an antiferromagnetic (AFM) layer, a pinned layer and a dusting layer comprising a non-magnetic, electrically conducting material between and in contact with the AFM layer and the pinned layer. The sensor stack also has a free layer composed of a material free of nickel (Ni). The reader sensor stack is thermally stable to at least 325° C.

Another particular implementation is a reader sensor stack having an AFM layer, a pinned layer and a dusting layer having a thickness no greater than 5 Angstroms, the dusting layer comprising a non-magnetic, electrically conducting material, and being between and in contact with the AFM layer and the pinned layer. The sensor stack also has a free layer composed of a material free of nickel (Ni).

Yet another particular implementation is a method of inhibiting elemental migration from an AFM layer in a reader sensor stack. The method includes providing a sensor stack having a dusting layer between and in contact with an AFM layer and a pinned layer, and a free layer composed of a material free of nickel (Ni). The dusting layer has a thickness less than 5 Angstroms and comprises a non-magnetic electrically conducting material. The method further includes annealing the sensor stack at a temperature of at least 325° C.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following detailed description.

BRIEF DESCRIPTIONS OF THE DRAWING

The described technology is best understood from the following Detailed Description describing various implementations read in connection with the accompanying drawings.

DETAILED DESCRIPTION

There is an increasing demand for high data densities and sensitive sensors to read data from a magnetic media. Giant Magnetoresistive (GMR) sensors commonly consist of three magnetic layers, one of which is a soft magnet, separated by a thin conductive, non-magnetic spacer layer such as copper, from the other magnetic layers. Tunnel Magnetoresistive (TMR) sensors provide an extension to GMR in which the electrons travel perpendicularly to the layers across a thin insulating tunnel barrier.

In general, for these magnetoresistive (MR) sensors, an antiferromagnetic material (AFM) layer (often called the "pinning layer") is placed adjacent to the first magnetic layer to prevent it from rotating. AFM materials exhibiting this property are termed "pinning materials". With its rotation inhibited by the AFM layer, the first layer is termed the "pinned layer" (PL). A soft magnetic layer rotates freely in response to an external field and is called the "free layer" (FL). A coupling spacer layer between the PL and the third magnetic layer, a "reference layer" (RL), provides an anti-ferromagnetic coupling (e.g., an RKKY coupling) between them, forming a synthetic antiferromagnetic (SAF) structure. The MR sensor can include other (e.g., non-magnetic) layers.

To operate the MR sensor properly, the sensor is preferably stabilized against the formation of edge domains because domain wall motion results in electrical noise that makes data recovery difficult. A common way to achieve stabilization is with a permanent magnet abutted junction design. In this scheme, permanent magnets with high coercive field (i.e., hard magnets) are placed at each end of the sensor. The field from the permanent magnets stabilizes the sensor and prevents edge domain formation, as well as provides proper bias. Another common way to provide the free layer bias is to use stabilized soft magnetic layers in place of the permanent magnets. The use of the AFM/PL allows for consistent and predictable orientation of the SAF structure. Furthermore, the use of the SAF structure stabilized by the AFM layer enables high amplitude linear response for a reader using the MR sensor.

On occasion, individual AFM grains will reorient their magnetic orientation, leading to degraded reader stability and possibly to sensor error. A reduction of the exchange coupling at the AFM/PL interface may increase the reader stability by reducing the effect of AFM grain reorientation, as long as sensor polarity is maintained. A decreased coupling at the AFM/PL interface lowers the reader's sensitivity to any AFM-induced instabilities and to any effects of magnetic dispersion that are inherently present in the AFM layer. However, one relies on the interface exchange to magnetically align the AFM grains during the high-temperature setting anneal process. As-deposited, the individual grains in the AFM layer are randomly oriented in the film plane. During the annealing process, the grains are magnetically oriented by the torque provided by the adjacent PL, which follows the external magnetic field applied during the process.

In certain aspects, utilizing a higher temperature anneal is beneficial. For example, as the anneal temperature increases, a higher MR signal may be obtained. During the annealing process, the crystallization of the reference and free magnetic layers initiates from a structurally ordered barrier layer (e.g., MgO barrier layer). High annealing temperatures may improve the coherency of the interfaces between the above-mentioned magnetic layers and the barrier layer, resulting in increased degree of crystallization and a higher MR signal.

However, utilizing higher temperature anneal can cause certain problems. For example, at higher temperatures, the thermal stability of the MR layers decreases due to the interdiffusion between various layers. As an particular example, nickel (Ni) present in the free layer may diffuse into the barrier layer, resulting in degraded MR. Additionally, at higher temperatures, the pinning characteristics of the AFM/PL interface degrade due to the interdiffusion between the AFM layer and the PL. For example, for AFM layers containing manganese (Mn), Mn atoms may diffuse from the AFM layer to the PL. As a result of this interdiffusion, interface exchange may degrade.

To address the problems caused by higher temperature annealing, a thin "dusting" layer of electrically conductive (e.g., metallic) non-magnetic material is positioned at the AFM/PL interface to inhibit interdiffusion, together with a Ni-free free layer (FL). The insertion of such dusting layer at the AFM/PL interface improves the robustness of the AFM/PL interface against high temperature anneals. In one implementation, this dusting layer has a thickness no more than 5 Angstroms and is between the AFM layer and the PL. The resulting sensor has improved thermal stability, which allows higher annealing temperatures without degrading the exchange coupling at the AFM/PL interface Annealing temperatures of 325° C., or 350° C., or 375° C. and, in some implementations, 400° C., can be used for sensors having the dusting layer and the Ni-free FL, the resulting sensor experiencing neither a substantive degradation of pinning characteristics nor a loss of MR signal. The resulting sensor may have improved pinning characteristics as a result of lower AFM dispersion coupled with controlled AFM-PL interface exchange and a higher MR ratio may be achieved due to better coherency of RL-barrier-FL interfaces.

In the following description, reference is made to the accompanying drawing that forms a part hereof and in which are shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

Figure 1:
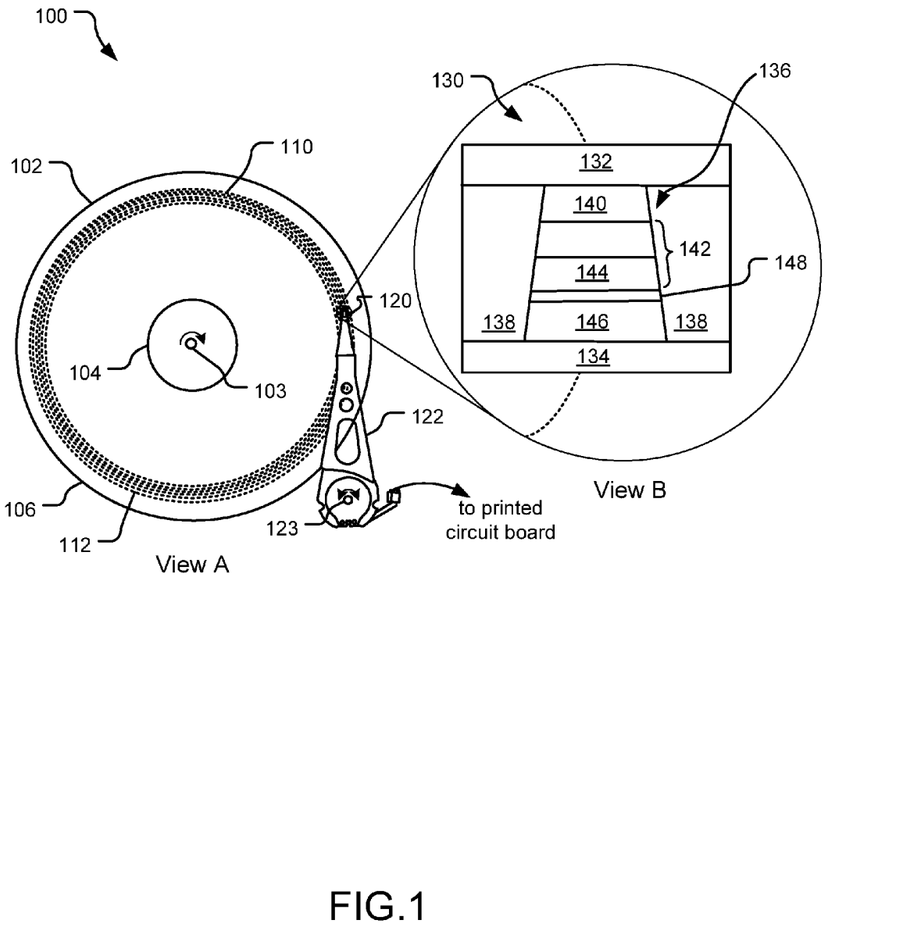
FIG. 1 is a perspective view of an example recording device using a reader having a sensor structure disclosed herein.

FIG. 1 illustrates a perspective view (View A) of an example recording device 100 (e.g., a disc drive assembly 100) using a reader disclosed herein. Recording device 100 includes a disc 102, which rotates about a spindle center or a disc axis of rotation 103 during operation. The disc 102 includes an inner diameter 104 and an outer diameter 106 between which are a number of concentric data tracks 110, illustrated by circular dashed lines. The data tracks 110 are substantially circular and are made up of regularly spaced bits 112, indicated as dots or ovals on the disc 102. It should be understood, however, that the described technology may be employed with other types of storage media, including continuous magnetic media, discrete track (DT) media, etc.

Information may be written to and read from the bits 112 on the disc 102 in different data tracks 110. A transducer head 120 is mounted on an actuator assembly 122 at an end distal to an actuator axis of rotation 123 and the transducer head 120 flies in close proximity above the surface of the disc 102 during disc operation. The actuator assembly 122, operably connected to electronics, such as a printed circuit board (PCB), rotates during a seek operation about the actuator axis of rotation 123 positioned adjacent to the disc 102. The seek operation positions the transducer head 120 over a target data track of the data tracks 110.

An exploded view (View B) illustrates an expanded view of a portion of the transducer head 120, with a reader sensor 130 illustrated by a schematic block diagram that illustrates an air-bearing surface (ABS) view of the reader sensor 130. That is, the exploded View B illustrates a portion of the transducer head 120 that faces the ABS of the disc 102 when the disc drive assembly 100 is in use. Thus, the reader sensor 130 shown in View B may be rotated by about 180 degrees about an axis (e.g., about a z-axis) when operationally attached to the transducer head 120. It is noted that the reader sensor 130 in View B is not necessarily illustrated with accurate dimensions and/or all of its elements, but rather, the emphasis is on pertinent features of the reader sensor 130 relevant to the current disclosure.

In the illustrated implementation, the reader sensor 130 is generically illustrated without details and without relative dimensions to include a top shield structure 132 and a bottom shield 134, with a sensor stack 136 between the shields 132, 134 along the down-track direction of the reader sensor 130. The top shield structure 132 and the bottom shield 134 each have low magnetic anisotropy and serve to shield the sensor stack 136 from noise and magnetic interference (e.g., flux) from adjacent data tracks 110 on the disc 102 and from nearby devices or components. Between the top shield structure 132 and the bottom shield 134, bounding the sensor stack 136 in the cross-track directions, are side shields 138 that bias the free layer of the reader sensor 130. The side shields 138 may further serve to shield the sensor stack 136 from noise and magnetic interference from nearby devices or components and from cross-track magnetic interference. The top shield structure 132 provides stabilization to the side shields 138.

Although not shown in detail in the exploded View B, sensor stack 136 includes multiple layers, including a free layer 140 that has a switchable magnetic orientation. The sensor stack 136 also includes a synthetic antiferromagnetic (SAF) structure 142, which includes a pinned layer 144. An antiferromagnetic (AFM) layer 146 is between the bottom shield 134 and the pinned layer 144. Not seen in the View B, the SAF structure 142 includes other layers, such as a reference layer and a spacer layer, which would be present between the pinned layer 144 and the reference layer. The sensor stack 136 also includes a dusting layer 148.

In an example implementation, the dusting layer 148 is a very thin (e.g., less than 5 Angstroms thick) non-continuous layer of an electrically conductive, non-magnetic material present between the AFM layer 146 and the pinned layer 144. Due to its thickness, the dusting layer 148 may have pinholes or other regions wherein there is no dusting layer material present between the AFM layer 146 and the pinned layer 144. The dusting layer 148 is in physical contact with the AFM layer 146 and the pinned layer 144, but is not magnetically coupled to either. Rather, the dusting layer 148, due to its non-continuous nature, allows direct interfacial (e.g., magnetic) exchange between the AFM layer 146 and the pinned layer 144.

Figure 2:
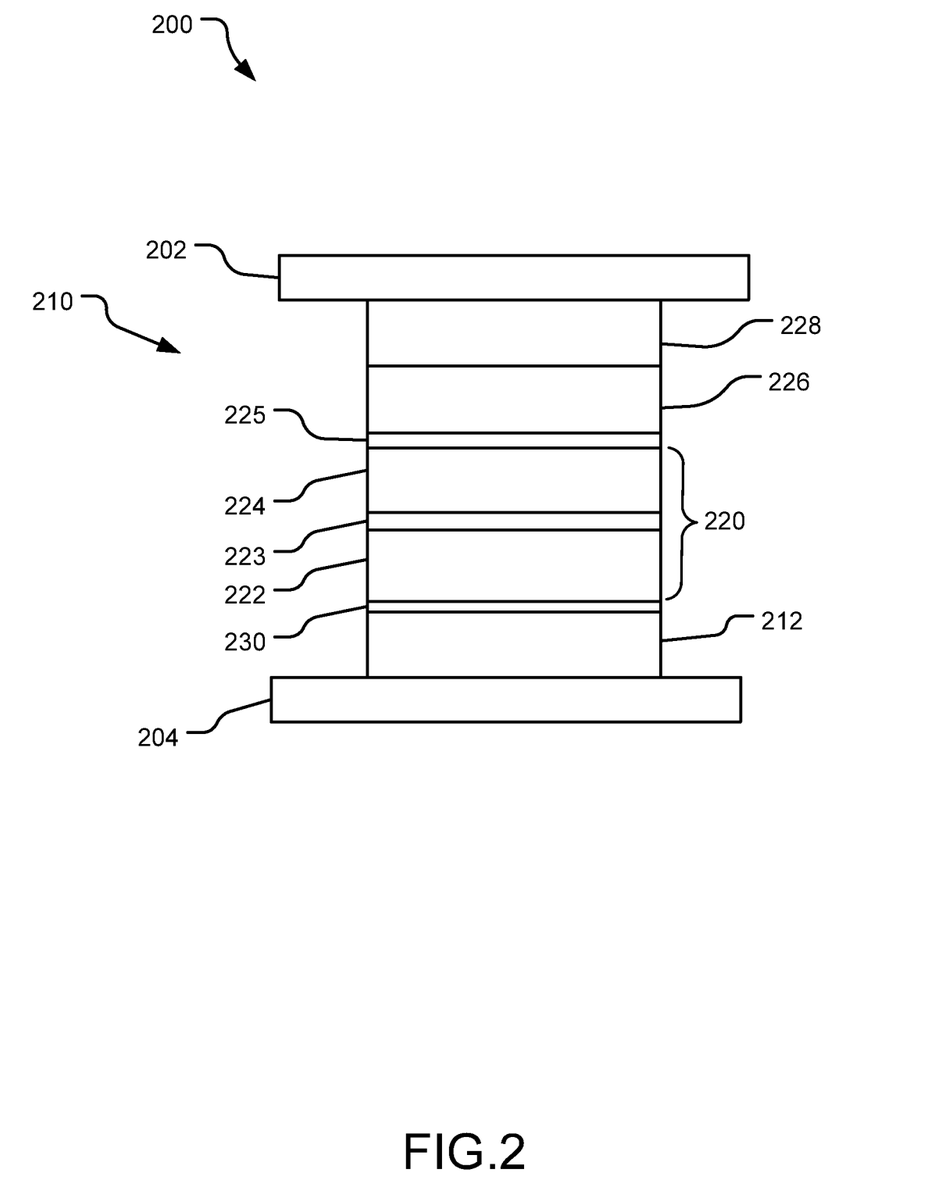
FIG. 2 is a schematic of an air-bearing surface (ABS) view of an example reader sensor structure having a dusting layer.

FIG. 2 illustrates an ABS view of an example, generic, implementation of a sensor structure having a non-magnetic dusting layer between a pinned layer and an AFM layer. In FIG. 2, a reader 200 includes a top shield structure 202 and a bottom bulk shield 204 on two opposite sides (along the down-track direction) of a sensor stack 210 that has multiple layers. Not illustrated in this figure but seen in FIG. 1, side shields are present around the sensor stack 210 in the cross-track or lateral direction, between the top shield structure 202 and the bottom shield 204. In the illustrated implementation, the side shields would encompass all of the layers of the sensor stack 210; in other implementations, for example, the side shields may not encompass one or more layers.

Proximate bottom bulk shield 204, the sensor stack 210 includes an AFM layer 212. Not shown, a seed layer may be present between the bottom shield 204 and the AFM layer 212 to promote the texture and grain formation of the AFM layer 212. Sensor stack 210 also has a SAF structure 220 composed of a pinned layer (PL) 222, a reference layer (RL) 224 and a spacer layer 223 therebetween. The SAF structure 220 is arranged with the pinned layer 222 closer to the AFM layer 212 than the reference layer 224. A free layer (FL) 226, which has a switchable magnetization orientation, is proximate to the reference layer 224 of the SAF structure 220, with a barrier layer 225 between the free layer 226 and the reference layer 224. A cap or capping layer 228 is proximate the free layer 226.

A non-continuous dusting layer 230 is present between the AFM layer 212 and the pinned layer 222 of the SAF structure 220. It has been found that the inclusion of the dusting layer 230 in the reader sensor 200 increases the thermal stability of the sensor 200, allowing a higher temperature anneal process; this may be due to the dusting layer 230 inhibiting the interdiffusion between the AFM layer 212 and the pinned layer 222. Further, inclusion of the dusting layer 230 may allow a decrease in the thickness of the AFM layer 212, compared to sensor stacks without a dusting layer; this is made possible by lowered destabilizing torque provide by the pinned layer 222. Decrease in the AFM layer 212 thickness reduces shield-to-shield spacing (SSS) and enables narrower gap high resolution readers.

The dusting layer 230 has a thickness of no more than 7 Angstroms, and in other implementations a thickness of no more than 5 Angstroms. In some implementations, the dusting layer 230 has a thickness in the range of 0.5 to 5 Angstroms, and in other implementations 1 to 3 Angstroms. Particular examples of thicknesses for the dusting layer 230 include 1 Angstrom, 2 Angstroms, 3 Angstroms, 4 Angstroms, and 5 Angstroms.

The dusting layer 230 is formed from a non-magnetic, optionally electrically conducting, material. The material should not be prone to atomic diffusion into other parts of the stack 210 at high temperatures. The material for the dusting layer 230 may be metallic; examples of suitable metallic materials are ruthenium (Ru), iridium (Ir), rhodium (Rh), gold (Au), silver (Ag), and platinum (Pt).

In addition to including the dusting layer 230, to increase thermal stability of the sensor 200, free layer 226 is free of Ni. By use of the phrase "free of Ni", "void of Ni", "Ni-free," or variations thereof, what is intended is that the free layer 226 has no more than 0.1 atomic % Ni. Examples of suitable materials for a free layer 226 free of Ni include CoFe and CoFeB. Multilayer structures of CoFe and/or CoFeB may be used, combined (e.g., alloyed, or layered) with another ferromagnetic material and/or a refractory material. An example alloy is CoFeX, where X is a refractory material such as tantalum (Ta), niobium (Nb), hafnium (Hf), zirconium (Zr), etc. An example material with a refractory material is CoFeTa.

Figure 3:
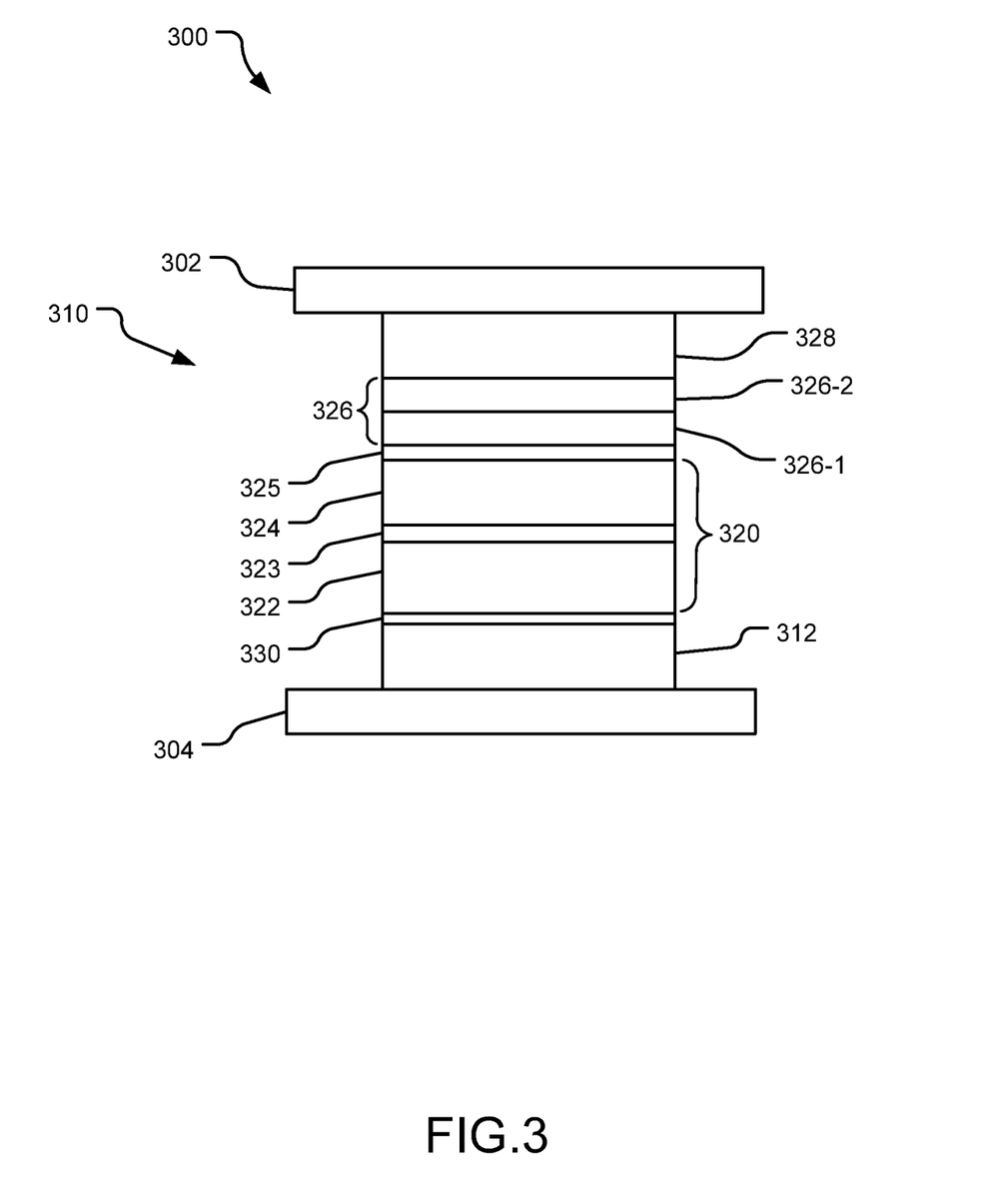
FIG. 3 is a schematic of an air-bearing surface (ABS) view of another example reader sensor structure having a dusting layer.

FIG. 3 illustrates another schematic block diagram of an ABS view of an example implementation of a sensor structure having a pinned stabilization layer between another pinned layer and an AFM layer. Unless indicated otherwise, the elements of FIG. 3 are comparable to like elements of FIG. 2.

A reader sensor 300 includes a top shield structure 302 and a bottom bulk shield 304 on two opposite sides (along the down-track direction) of a sensor stack 310. Proximate the bottom bulk shield 304, the sensor stack 310 includes an AFM layer 312. Not shown, a seed layer may be present between the bottom shield 304 and the AFM layer 312 to promote the texture and grain formation of the AFM layer 312. Sensor stack 310 also has a SAF structure 320 composed of a pinned layer (PL) 322, a reference layer (RL) 324 and a spacer layer 323 therebetween. A multi-layer free layer (FL) 326 with a switchable magnetization orientation is proximate to the reference layer 324 of the SAF structure 320, having a first FL layer 326-1 and a second FL layer 326-2. A barrier layer 325 is between the free layer 326 and the reference layer 324. A cap or capping layer 328 is proximate the free layer 326.

A non-continuous dusting layer 330 is present between the AFM layer 312 and the pinned layer 322. Inclusion of the dusting layer 330 in the reader sensor 300 increases the thermal stability of the sensor 300, and may inhibit the interdiffusion between the AFM layer 312 and the pinned layer 322.

In addition to including the dusting layer 330, to increase thermal stability of the sensor 300, free layer 326 is Ni-free. Examples of suitable materials free of Ni for first FL layer 326-1 include CoFeB and CoFe/CoFeB. Examples of suitable materials for second FL layer 326-2 include alloys of a ferromagnetic material and a refractory material (X). An example alloy is ferromagnetic material (e.g., Co, Fe, or CoFe), with a refractory material such as Ta, Nb, Hf, Zr, etc. The amount of refractory material can be less than 30 weight % of the second FL layer 326-2. The second FL layer 326-2 may or may not be amorphous.

Other particulars of the specific construction of the reader sensors 200, 300 are not of particular relevance to the dusting layers 230, 330 in the reader sensors 200, 300 and a detailed discussion of the other elements of the reader sensors 200, 300 is not provided herein. Unless indicated otherwise, the various layers of the reader sensors 200, 300 are known materials for those elements.

Figure 4:
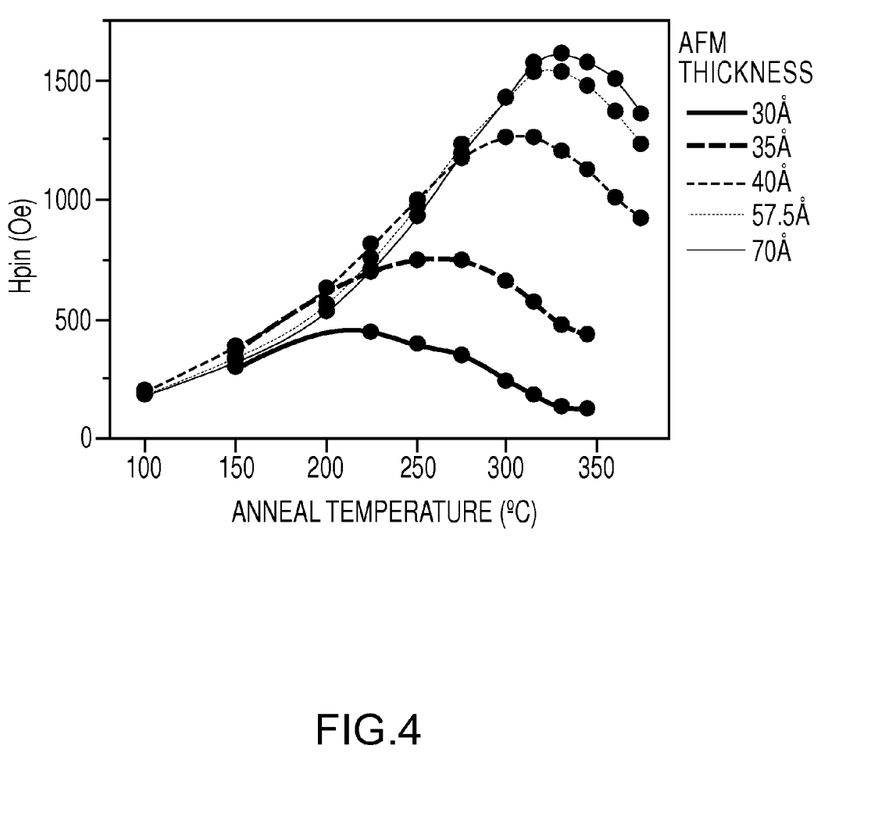
FIG. 4 is a graphical representation of the pinning field on partial reader sensor structure without a dusting layer at the AFM/PL interface.
Figure 5:
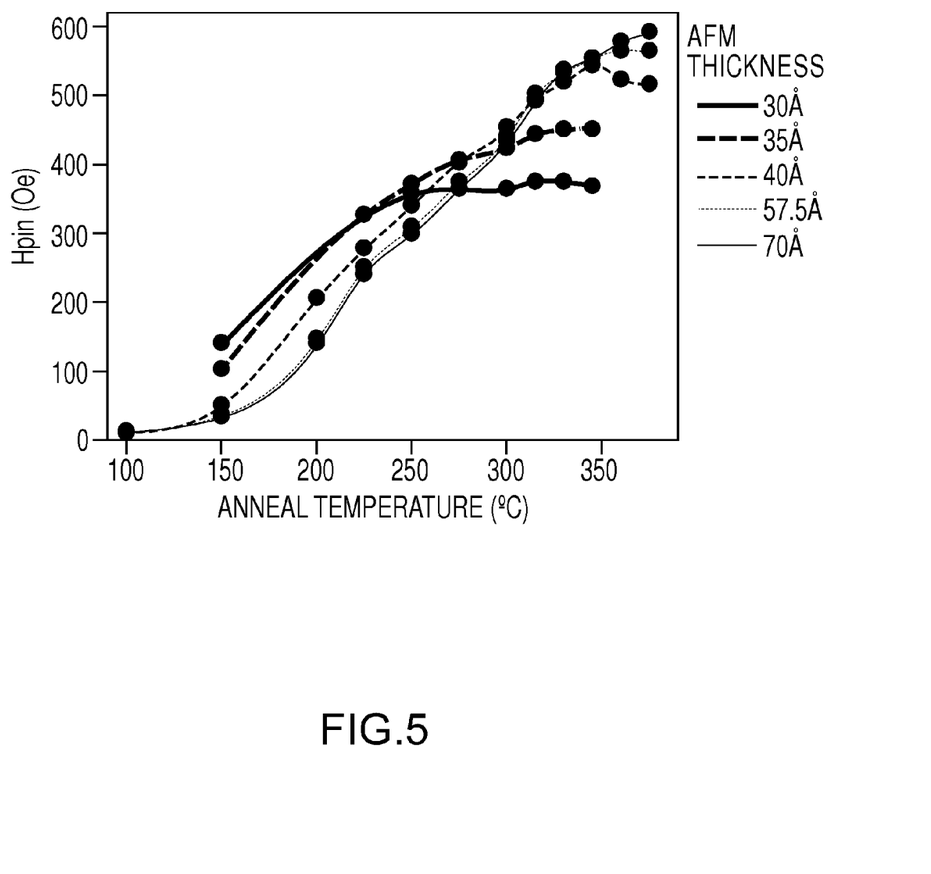
FIG. 5 is a graphical representation of the pinning field on partial reader sensor layers having a dusting layer at the AFM/PL interface.

FIG. 4 demonstrates that, without the presence of a dusting layer, thermal degradation occurs. FIG. 5 demonstrates the increase of thermal stability due to the inclusion of a dusting layer at an AFM/PL interface. The structures tested for FIGS. 4 and 5 were not complete reader structures or read sensor stacks, but only had the bottom portion of full reader stacks—seed layer, AFM layer, PL, and capping layer.

The AFM layer is composed of numerous individual grains. As-deposited, the magnetic orientations of individual grains are randomly distributed in the plane of the AFM film. During the annealing process, the magnetic orientations of the grains are magnetically reoriented by the torque provided by the adjacent PL, which follows the external magnetic field applied during the process. In general, increased temperature facilitates alignment of the magnetic orientations of the grains. Assuming the structure does not evolve as a result of the thermal treatment, the alignment of the magnetic orientation of the individual grains in the AFM layer improves and the resulting pinning field increases. However, for thinner AFM layers, because the volume of the AFM grains is low, complete alignment of the magnetic orientation of the grains is achieved at relatively low temperatures and thus does not improve further with anneal temperature increase. Any degradation at the AFM/PL interface that may concurrently occur during anneal would manifest itself as pinning field reduction.

FIG. 4 shows the pinning field drops after subsequent anneals for a series of bilayers with varied thickness of the AFM layer (from 30 Angstroms to 70 Angstroms) without a dusting layer at the AFM/PL interface; this is indicative of diffusion from the AFM layer. FIG. 5 shows the pinning field for the same constructions but with a 2 Angstrom thick ruthenium (Ru) dusting layer at the AFM/PL interface after subsequent anneals; this shows the benefits of having the dusting layer present in the construction.

The drop in pinning field as a function of the anneal temperature, seen in FIG. 4, is the manifestation of disorder that occurs at the AFM/PL interface. Such uncontrollable disorder at the AFM/PL interface effectively increases the AFM layer dispersion and is a source of reader instability and sensor performance degradation.

FIG. 5 shows the pinning field for structures having a 2 Angstrom Ru dusting layer at the AFM/PL interface. In contrast with the structures of FIG. 4 without a dusting layer, the pinning field for structures with thin AFM layers does not show a drop with increasing anneal temperature. This shows that the dusting layer helps preserve the magnetic order at the AFM/PL interface during thermal treatment. This thermal robustness widens stack anneal options, allowing higher anneal temperatures that provide higher MR ratio.

It is believed that the non-magnetic dusting layer, particularly Ru, inhibits and, in some implementations stops, atomic (elemental) migration between the AFM layer and the PL. For example, for AFM layers having manganese (Mn), the dusting layer (particularly, Ru) inhibits diffusion of Mn atoms from the AFM layer. Other dusting layer materials may also inhibit Mn migration. Further, Ru and other dusting layer materials may inhibit other migration.

In addition to the dusting layer inhibiting interdiffusion, the dusting layer provides a controllable reduction of exchange anisotropy at the AFM/PL interface without altering the AFM grain anisotropy. This decreases the probability of undesired switching of the magnetic orientation of the AFM grains and lowers the SAF response if a grain reorientation does occur. Although a lower exchange anisotropy at the interface may hinder setting the magnetic orientation in the AFM layer grain during the stack anneal process, thermal robustness of the AFM/PL interface enabled by the dusting layer allows an increase in the anneal temperature which will compensate for the lower exchange at the interface.

All of the read sensors described above, e.g., readers 130, 200, 300, and variations thereof, can be fabricated by various thin-film manufacturing techniques, including sputtering, plating, deposition, etching, ion milling, and other processing techniques.

Figure 6:
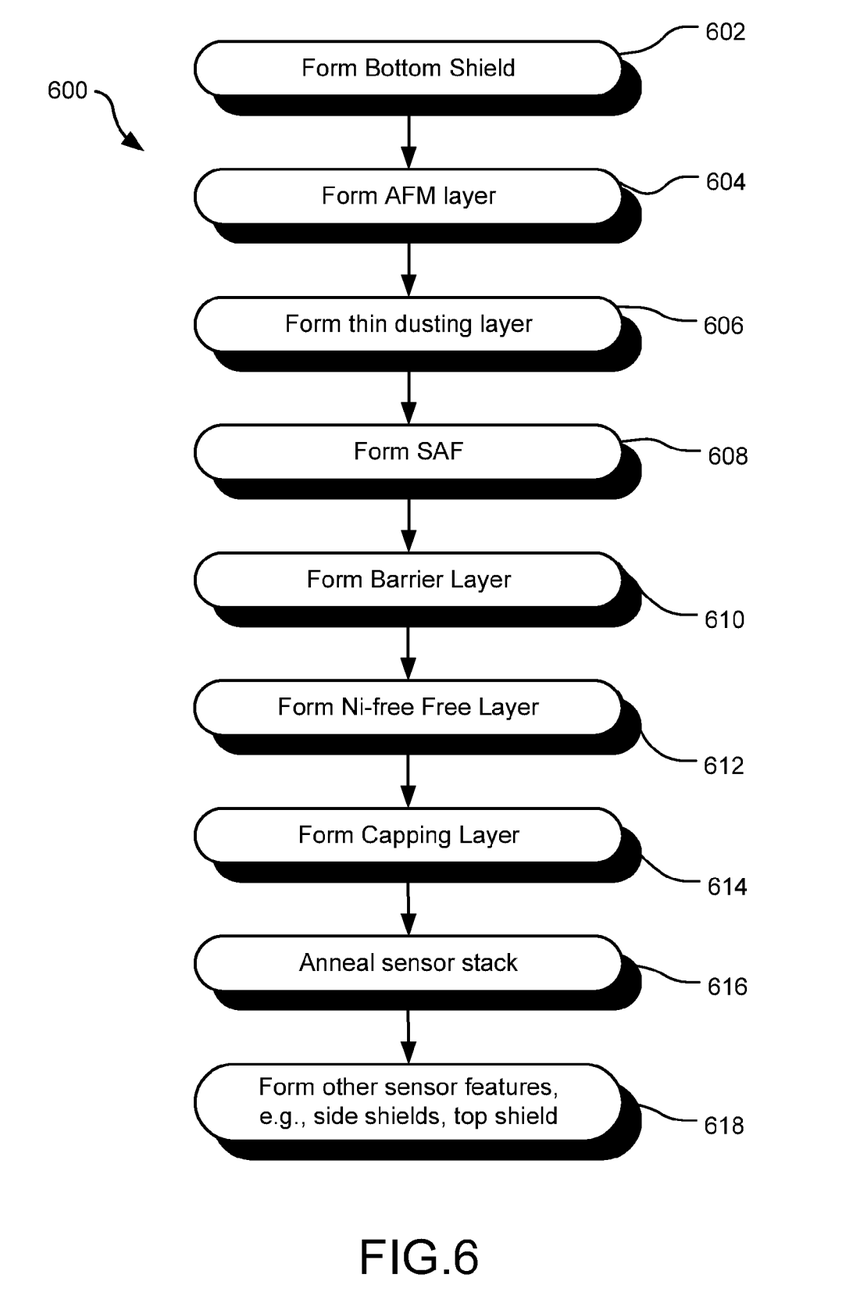
FIG. 6 is a flowchart illustrating an example method of forming an example reader sensor structure.

In reference now to FIG. 6, a flowchart illustrates an example method 600 for forming a read sensor structure having a thin dusting layer between the pinned layer and the AFM layer. The method involves operation 602 of forming a bottom shield layer on a substrate. This operation does not require forming the bottom shield directly on the substrate, as intervening materials/layers may be present between the bottom shield and substrate. A sensor stack is formed on the bottom shield in operations 604 through 612. This operation does not require forming the sensor stack directly on the bottom shield, as intervening materials/layers may be present between the bottom shield and sensor stack. For example, a seed layer often is present directly on the bottom shield. In operation 604, an AFM layer is formed. Directly on and in contact with the AFM layer, a thin dusting layer, having a thickness of no more than 5 Angstroms, is formed in operation 606. The thin dusting layer is formed from an electrically conductive material, and may be a non-continuous layer on the AFM layer. A SAF structure is formed in operation 608 directly on and in contact with the dusting layer, the SAF structure having at least a pinned layer in contact with the dusting layer and a reference layer. A barrier layer is formed over the SAF structure in operation 610, and then a free layer free of Ni is formed over the barrier layer in operation 612. A capping layer is formed in operation 614. After formation of the sensor stack, the stack is annealed in operation 616 under high temperature and in the presence of a magnetic field. The annealing temperature can be as high as 325° C., or 350° C., or 375° C. and, in some implementations, 400° C. The remainder of the read sensor structure is formed in operation 618, which includes forming side shields, a top shield structure, and other parts of the read sensor.

The above specification and examples provide a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "bottom," "lower", "top", "upper", "beneath", "below", "above", "on top", "on," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A method comprising:
providing a sensor stack having a non-continuous dusting layer between and in contact with but not magnetically coupled to an antiferromagnetic (AFM) layer and a pinned layer, and a free layer composed of a material free of nickel, the dusting layer having a thickness less than 5 Angstroms and comprising a non-magnetic electrically conducting material; and
annealing the sensor stack at a temperature of 325° C. to 400° C.

2. The method of claim 1 wherein the dusting layer of the sensor stack comprises at least one of Ru or Ir.

3. The method of claim 1, wherein the free layer of the sensor stack comprises CoFeTa, CoFeB, or CoTa.

4. The method of claim 1, wherein the AFM layer has a thickness of 40 Angstroms or less.

5. A method comprising:
providing a reader sensor stack having an antiferromagnetic (AFM) layer having a thickness of 40 Angstroms or less, a pinned layer, a non-magnetic electrically conducting, non-continuous dusting layer having a thickness no greater than 5 Angstroms between and in contact with the AFM layer and the pinned layer, and a free layer composed of a material free of nickel; and
annealing the sensor stack at a temperature of 325° C. to 400° C.

6. The method of claim 5 wherein the thickness of the dusting layer is in the range of 1 to 3 Angstroms.

7. The method of claim 5 wherein the dusting layer comprises at least one of Ru or Ir.

8. The method of claim 5, wherein the free layer comprises CoFeTa, CoFeB, or CoTa.

9. A method comprising:
providing a reader sensor structure comprising an antiferromagnetic (AFM) layer comprising manganese (Mn), a pinned layer, a non-magnetic, electrically conducting dusting layer consisting of one of ruthenium (Ru) or iridium (Ir) and having a thickness no greater than 5 Angstroms with pinholes therethrough, the dusting layer between and in contact with both the AFM layer and the pinned layer, and a nickel-free (Ni-free) free layer; and
annealing the sensor stack at a temperature of 325° C. to 400° C.

10. The method of claim 9 wherein the free layer comprises CoFe, CoFeB, or CoFeX, where X is a refractory material.

11. The method of claim 10 wherein the free layer comprises CoFeX and the refractory material is tantalum (Ta), niobium (Nb), hafnium (Hf), or zirconium (Zr).

12. The method of claim 10, wherein the free layer comprises multiple layers.

13. The method of claim 9, wherein the AFM layer has a thickness of 40 Angstroms or less.

* * * * *